(12) United States Patent
Kang et al.

(10) Patent No.: US 10,032,503 B2
(45) Date of Patent: Jul. 24, 2018

(54) SEMICONDUCTOR MEMORY DEVICE PERFORMING REFRESH OPERATION BASED ON WEAK CELL INFORMATION STORED IN MEMORY ARRAY REGION AND OPERATING METHOD THEREOF

(71) Applicant: SK hynix Inc., Gyeonggi-do (KR)

(72) Inventors: Kyeong-Pil Kang, Gyeonggi-do (KR); Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 10 days.

(21) Appl. No.: 15/342,493

(22) Filed: Nov. 3, 2016

(65) Prior Publication Data
US 2017/0372767 A1   Dec. 28, 2017

(30) Foreign Application Priority Data

Jun. 27, 2016  (KR) .................. 10-2016-0080146

(51) Int. Cl.
*G11C 7/00* (2006.01)
*G11C 11/408* (2006.01)
*G11C 11/4072* (2006.01)
*G11C 11/406* (2006.01)

(52) U.S. Cl.
CPC ...... *G11C 11/4087* (2013.01); *G11C 11/4072* (2013.01); *G11C 11/40615* (2013.01); *G11C 11/40622* (2013.01); *G11C 2211/4061* (2013.01)

(58) Field of Classification Search
CPC .......... G11C 11/4087; G11C 11/40615; G11C 11/40622; G11C 11/4072
USPC .................. 365/189.07, 222, 189.02, 230.06
See application file for complete search history.

(56) References Cited

U.S. PATENT DOCUMENTS

| | | | | |
|---|---|---|---|---|
| 9,607,679 B1 * | 3/2017 | Kim | .................. | G11C 11/40615 |
| 9,697,885 B1 * | 7/2017 | Kim | .................. | G11C 11/4093 |
| 2015/0043295 A1 * | 2/2015 | Kim | .................. | G11C 11/406 365/222 |
| 2016/0163373 A1 * | 6/2016 | Hyun | .................. | G11C 11/4087 365/189.05 |
| 2017/0084353 A1 * | 3/2017 | Park | .................. | G11C 29/78 |

FOREIGN PATENT DOCUMENTS

KR   1020120049031   5/2012

* cited by examiner

*Primary Examiner* — Connie Yoha
(74) *Attorney, Agent, or Firm* — IP & T Group LLP

(57) ABSTRACT

A semiconductor memory device including a weak cell storage circuit suitable for programming therein weak cell information, and outputting the weak cell information in an initialization operation; a cell array region including a first cell region which stores the weak cell information received from the weak cell storage circuit, in the initialization operation; a refresh address generation block suitable for generating a refresh address by counting a refresh signal, and outputting a weak cell address corresponding to the weak cell information outputted from the first cell region, as the refresh address, with a predetermined cycle; and a refresh circuit suitable for performing a refresh operation for a word line corresponding to the refresh address, among a plurality of word lines.

23 Claims, 17 Drawing Sheets

SEMICONDUCTOR MEMORY DEVICE PERFORMING REFRESH OPERATION BASED ON WEAK CELL INFORMATION STORED IN MEMORY ARRAY REGION AND OPERATING METHOD THEREOF

CROSS-REFERENCE TO RELATED APPLICATION

This application claims priority under 35 U.S.C. § 119 to Korean Patent Application No. 10-2016-0080146, filed on Jun. 27, 2016, the disclosure of which is herein incorporated by reference in its entirety.

TECHNICAL FIELD

Exemplary embodiments relate to a semiconductor design technology, and more particularly, to a semiconductor memory device which performs a refresh operation.

DISCUSSION OF THE RELATED ART

In general, a memory cell of a semiconductor memory device such as a dynamic random access memory (DRAM) is constructed by a transistor serving as a switch and a capacitor storing charges or data. Data is identified as 'high' (logic 1) or 'low' (logic 0) depending on whether charges are present in the capacitor of the memory cell, that is, whether the voltage of the terminal of the capacitor is high or low.

In principle, storage of data does not consume power because the storage of data is implemented in such a manner that charges are accumulated in a capacitor. However, data may be lost since an initial amount of charges stored in the capacitor may vanish due to leakage current attributable to the PN coupling of a metal-oxide-semiconductor (MOS) transistor, or the like. To prevent this, data in a memory cell should be read before the data is lost, and a normal amount of charges should be recharged based on a read information. Storage of data may be retained only when such an operation is periodically repeated. Such a process for recharging cell charges is referred to as a refresh operation.

The refresh operation is performed each time a refresh command is inputted from a memory controller to a memory. The memory controller transmits the refresh command to the memory with a predetermined time interval by considering the data retention time of the memory. For example, if the data retention time of a memory is 64 ms and entire memory cells in the memory may be refreshed when a refresh command is received 8000 times, the memory controller transmits the refresh command to the memory 8000 times for 64 ms.

In a test process of a memory device, if the data retention time of some of the memory cells included in the memory device do not exceed a predetermined reference time, the corresponding memory device is handled as a fail. The memory device handled as a fail in this way should be discarded.

If all of the memory devices including memory cells having data retention times not exceeding a reference time, that is, all of the memory devices including weak cells are handled as fails, a problem may be caused in that the yield will decrease. Furthermore, although a memory device has passed a test, an error may occur if a weak cell is induced due to a posterior factor.

Moreover, as an ultra-high degree of integration results due to the fact that at least several tens of millions of cells are integrated in one chip, the probability of a weak cell to exist increases even through manufacturing processes are efficient. If a test is not precisely carried out for such a weak cell, it may be difficult to secure reliability of a semiconductor memory device.

Therefore, a scheme for detecting and screening a weak cell is being researched through various methods.

SUMMARY

Various embodiments are directed to a semiconductor memory device capable of performing a refresh operation based on a weak cell information stored in a memory array region, and an operating method thereof.

In an embodiment, a semiconductor memory device may include: a weak cell storage circuit suitable for programming therein weak cell information, and outputting the weak cell information in an initialization operation; a cell array region including a first cell region which stores the weak cell information received from the weak cell storage circuit, in the initialization operation; a refresh address generation block suitable for generating a refresh address by counting a refresh signal, and outputting a weak cell address corresponding to the weak cell information outputted from the first cell region, as the refresh address, with a predetermined cycle; and a refresh circuit suitable for performing a refresh operation for a word line corresponding to the refresh address, among a plurality of word lines.

In an embodiment, a semiconductor memory device may include: a weak cell storage circuit suitable for programming therein weak cell information, and outputting the weak cell information in an initialization operation; a cell array region suitable for storing data in memory cells selected according to a word line enable signal and a column select signal, and including a first cell region which stores the weak cell information received from the weak cell storage circuit, in the initialization operation; a refresh control circuit suitable for outputting a target row address by selecting a refresh address generated based on a refresh signal or a row address, storing the weak cell information from the first cell region in response to the refresh signal, and generating the refresh address based on the stored weak cell information such that a refresh cycle is controlled; a row circuit suitable for decoding the target row address and activating the word line enable signal; and a column circuit suitable for decoding a column address and outputting the column select signal.

In an embodiment, a method for operating a semiconductor memory device including a memory array region may include: storing weak cell information received from a weak cell storage circuit, in a first cell region of the memory array region, in an initialization operation; generating a refresh address by counting a refresh signal in a refresh operation, and outputting a weak cell address corresponding to the weak cell information outputted from the first cell region, as the refresh address, with a predetermined cycle; and performing the refresh operation for a word line corresponding to the refresh address, among a plurality of word lines.

In the semiconductor memory device according to the embodiments, since a dummy mat or a dummy cell region provided in a memory array region is used as a weak cell information storage region, the areas of storage circuits such as existing latches and the areas of circuits for generating control signals associated therewith may be reduced.

Additionally, in the semiconductor memory device according to the embodiments, through controlling a refresh cycle by using the weak cell information stored in the

DETAILED DESCRIPTION

Figure 1:
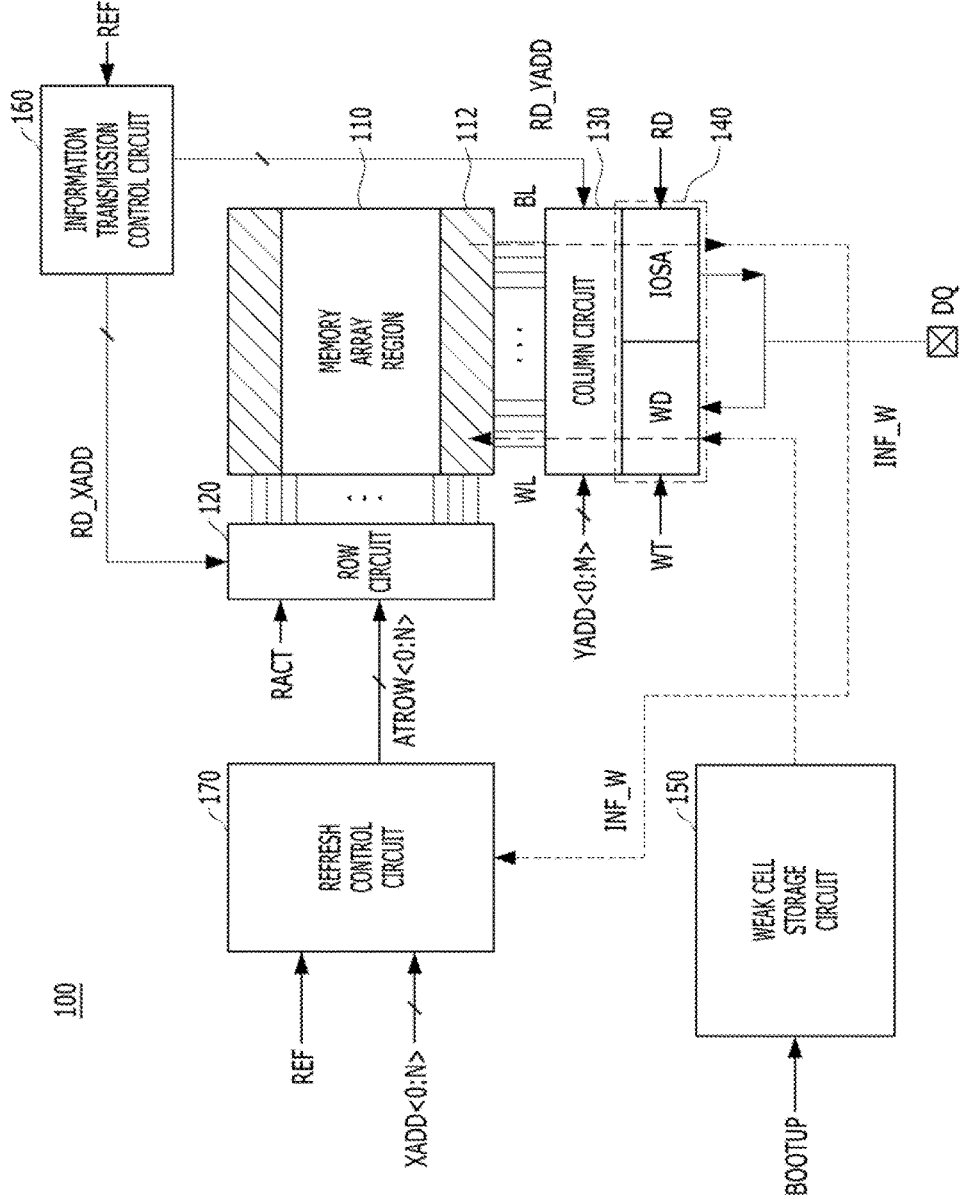
FIG. 1 is a block diagram illustrating a semiconductor memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

1 In general, after tests are performed through various methods for a weak cell, information on a detected weak cell hereinafter, referred to as a 'weak cell information', is stored in a nonvolatile memory such that the stored data may be retained even though power supply is cut off.

If the weak cell information stored in the nonvolatile memory is used in a normal operation by being immediately read out after power is supplied again, an error may occur in an operation due to degradation in reliability. Therefore, after storing, in a boot-up operation, the weak cell information stored in the nonvolatile memory, in a storage circuit such as a latch, a necessary operation for example, a refresh operation may be performed, in a normal operation, by using the weak cell information stored in the latch.

Furthermore, as the capacity of a semiconductor memory device increases, the number of weak cells increases together, and accordingly, the capacities of a nonvolatile memory for programming weak cell information and a weak cell information storage circuit increase together. Thus, in the entire semiconductor memory device, the area occupied by unit latches disposed in the weak cell information storage circuit increases.

Hereinbelow, descriptions will be made for a method capable of reducing the area of a circuit for storing weak cell information, through storing weak cell information by using a memory array region instead of a weak cell information storage circuit. In particular, in an embodiment of the present disclosure, after storing weak cell information in a partial region for example, a dummy cell region in the memory array region, a refresh operation may be selectively performed by using the stored weak cell information.

FIG. 1 is a block diagram illustrating a semiconductor memory device 100 in accordance with an embodiment of the present invention. As an example, FIG. 1, illustrates a semiconductor memory device which includes one memory bank.

Referring to FIG. 1, the semiconductor memory device 100 includes a memory array region 110, a row circuit 120, a column circuit 130, a data input/output circuit 140, a weak cell information storage circuit 150, an information transmission control circuit 160, and a refresh control circuit 170.

For reference, while not shown in a drawing, a command decoder (not shown) for decoding commands (RST, /CS, /RAS, /CAS and /WE) inputted from an exterior, in response to a clock signal (CLK), and generating a refresh signal REF, a write signal WT, a read signal RD, an active signal (ACT) and a precharge signal (PCG), and an active signal generation circuit (not shown) for generating a row active signal RACT in response to the active signal (ACT) and the precharge signal (PCG), may be included. Furthermore, an address buffer (not shown) for buffering an external address (ADD) and outputting a row address XADD<0:N> and a column address YADD<0:M> may be additionally included.

The memory array region 110 may include a plurality of cell mats, each of which includes memory cells capable of storing data. Memory cells may be coupled with the row circuit 120 through word lines WL, and may be coupled with the column circuit 130 through bit lines BL. Data may be stored in memory cells selected according to a word line enable signal provided from the row circuit 120 and a column select signal provided from the column circuit 130. The memory array region 110 in accordance with the embodiment may be constructed using volatile memory cells. The memory array region 110 may be constructed using dynamic random access memory (DRAM) memory cells. For reference, the memory array region 110 may include a normal cell region (not shown) and a redundancy cell region (not shown). If a failed cell, that is, a repair target memory cell is found in the normal cell region, a normal word line on which the repair target memory cell is positioned may be replaced with a redundancy word line of the redundancy cell region. Detailed descriptions for such a repair operation will be omitted herein.

In the embodiment of the present disclosure, a partial region of the memory array region 110 may be allocated as a weak cell information storage region 112 for storing weak cell information INF_W read out from the weak cell storage circuit 150. That is, the partial region of the memory array region 110 may be allocated as the weak cell information storage region 112 for storing the weak cell information INF_W, and the remaining region of the memory array region 110 may be allocated as a normal memory cell region for storing data in a normal operation. The weak cell information storage region 112 may be allocated by a dummy mat or a dummy cell region of the memory array region 110.

The weak cell storage circuit 150 may be constructed by a nonvolatile memory which includes a plurality of fuses (not shown) for programming the weak cell information INF_W. The weak cell storage circuit 150 may start an operation of reading out the programmed weak cell information INF_W, in response to a boot-up signal BOOTUP. The weak cell storage circuit 150 may read out the programmed weak cell information INF_W when the boot-up signal BOOTUP is enabled. In an embodiment, the weak cell storage circuit 150 may be constructed by one of nonvolatile memories such as an array e-fuse (ARE) circuit, a NAND flash memory, a NOR flash memory, a magnetic random access memory (MRAM), a spin torque transfer magnetic random access memory (STT-MRAM), a resistive random access memory (ReRAM) and a phase change random access memory (PCRAM). Moreover, in another embodiment, the weak cell storage circuit 150 may be implemented by a circuit capable of receiving and storing weak cell information stored in external test equipment.

The row circuit 120 may generate a word line enable signal for activating a word line WL corresponding to a target row address ATROW<0:N> received from the refresh control circuit 170, in response to the row active signal RACT. For reference, the row circuit 120 may operate, in a refresh operation, as a refresh circuit which performs the refresh operation by activating a word line corresponding to a refresh address.

The column circuit 130 may decode the column address YADD<0:M>, and generate a column select signal for accessing data of a specified bit line BL. In a boot-up operation, the weak cell information INF_W read out from the weak cell storage circuit 150 may be stored in the memory cells of the weak cell information storage region 112 which are selected according to the word line enable signal and the column select signal.

The data input/output circuit 140 may include a sense amplifier IOSA and a write driver WD. The sense amplifier IOSA outputs data transferred from a bit line BL selected by the column address YADD<0:M>, to a DQ pad, in response to the read signal RD in a read operation. The write driver WD transfers and stores data inputted through the DQ pad, to the bit line BL corresponding to the column address YADD<0:M>, in response to the write signal WT in a write operation.

The information transmission control circuit 160 may generate a row information address RD_XADD and a column information address RD_YADD to sequentially output the weak cell information INF_W stored in the weak cell information storage region 112, by the unit of predetermined bits, when the refresh signal REF is received. That is, if the refresh signal REF is received, the row circuit 120 may activate a word line corresponding to the row information address RD_XADD, and the column circuit 130 may select a bit line corresponding to the column information address RD_YADD. Accordingly, in the refresh operation, the weak cell information INF_W stored in the weak cell information storage region 112 may be outputted sequentially to the refresh control circuit 170 by the unit of predetermined bits.

The refresh control circuit 170 may output the target row address ATROW<0:N> by selecting the row address XADD<0:N> or a refresh address REF_ADD<0:N> generated by counting the refresh signal REF. The refresh control circuit 170 may output the target row address ATROW<0:N> by selecting the row address XADD<0:N>, in an operation other than the refresh operation. Further, the refresh control circuit 170 may output the target row address ATROW<0:N> by selecting the refresh address REF_ADD<0:N> generated by counting the refresh signal REF, in the refresh operation. In the refresh operation, the refresh control circuit 170 may receive and store the weak cell information INF_W outputted by the unit of predetermined bits from the weak cell information storage region 112, and generate the refresh address REF_ADD<0:N> such that a refresh cycle may be controlled based on the stored weak cell information INF_W.

In the semiconductor memory device in accordance with the embodiment of the present disclosure, in the boot-up operation, the weak cell information INF_W programmed in the weak cell storage circuit 150 may be transmitted to and stored in the partial region of the memory array region 110 that is, the weak cell information storage region 112). Furthermore, in the refresh operation, a refresh cycle may be controlled by using the weak cell information INF_W stored in the weak cell information storage region 112. As a consequence, by additionally performing a refresh for a weak cell between normal refreshes while lengthening an entire refresh interval, the amount of current consumed due to the refresh operation may be reduced and the reliability of a chip may be improved. Moreover, by using the dummy mat or the dummy cell region provided in the memory array region 110 as the weak cell information storage region 112, the areas of storage circuits such as existing latches and the areas of circuits for generating control signals associated therewith may be reduced.

Hereinafter, a detailed description of embodiments of the present disclosure will be described with reference to the drawings.

Figure 2:
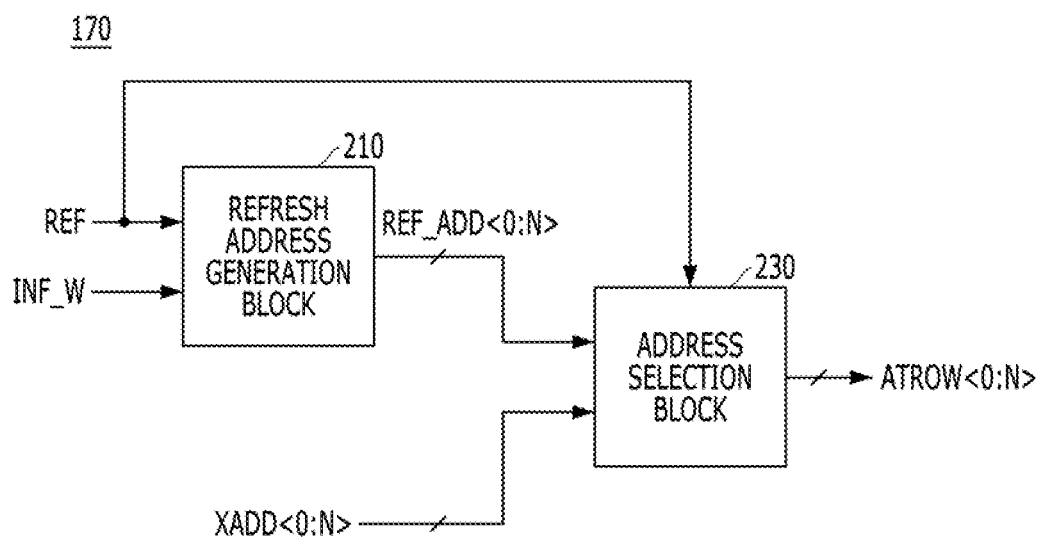
FIG. 2 is a detailed block diagram illustrating a refresh control circuit shown in FIG. 1.

FIG. 2 is a detailed block diagram illustrating the refresh control circuit 170 shown in FIG. 1.

Referring to FIG. 2, the refresh control circuit 170 may include a refresh address generation block 210 and an address selection block 230.

The refresh address generation block 210 may generate the refresh address REF_ADD<0:N> by counting the refresh signal REF which toggles with a predetermined cycle. The refresh address generation block 210 may output a weak cell address corresponding to the weak cell information INF_W which is received from the weak cell information storage region 112 by the unit of predetermined bits with a predetermined cycle, as the refresh address REF_ADD<0:N>.

The address selection block 230 may output the target row address ATROW<0:N> by selecting one of the refresh address REF_ADD<0:N> and the row address XADD<0:N> received from an address buffer (not shown), in response to the refresh signal REF. The address selection block 230 may select and output the refresh address REF_ADD<0:N> in the refresh operation, and may select and output the row address XADD<0:N> in an operation other than the refresh operation.

Figure 3:
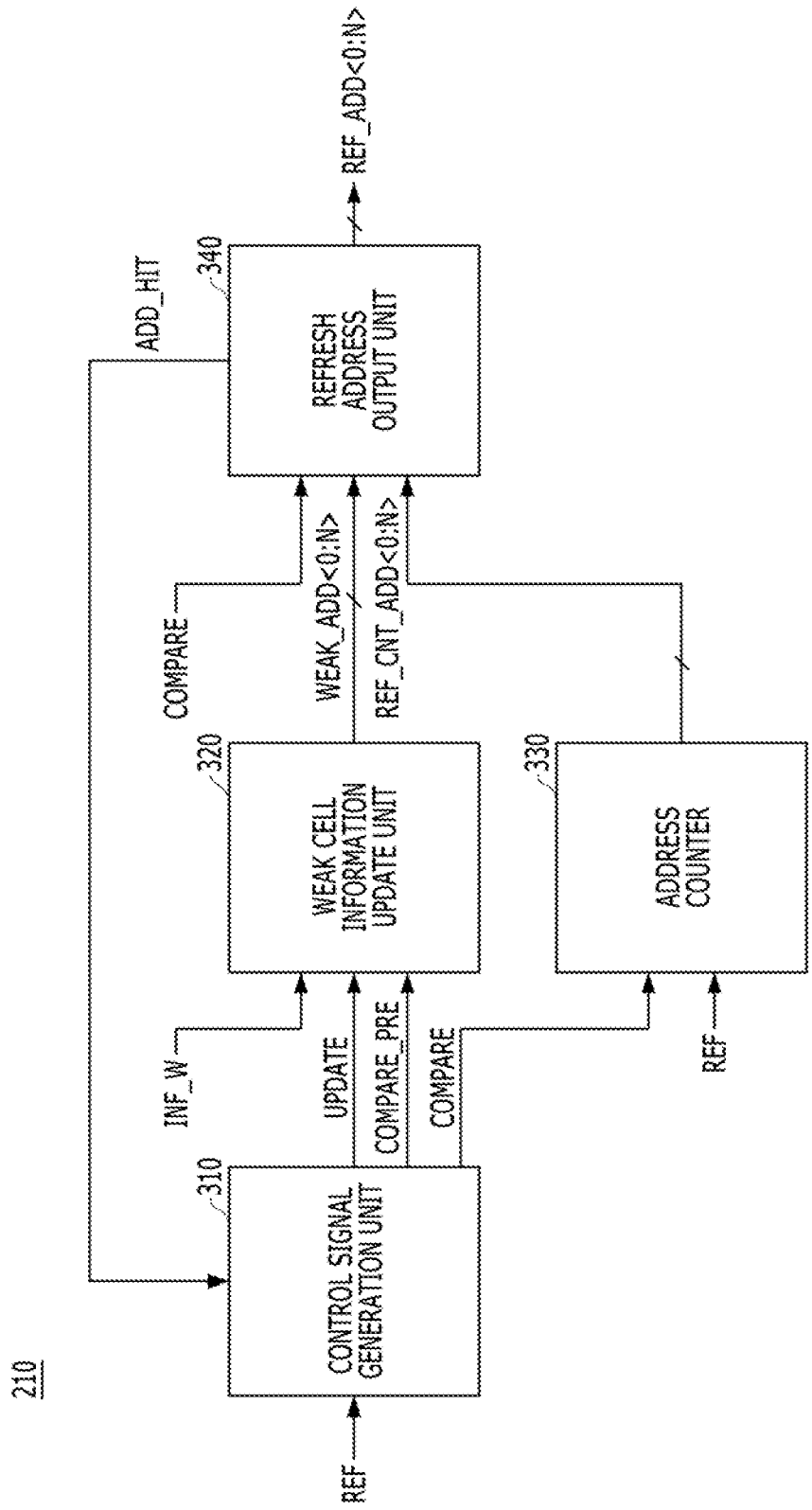
FIG. 3 is a detailed block diagram illustrating a refresh address generation block shown in FIG. 2 in accordance with an embodiment of the present invention.

FIG. 3 is a detailed block diagram illustrating the refresh address generation block 210 shown in FIG. 2 in accordance with an embodiment of the present invention.

Referring to FIG. 3, the refresh address generation block 210 may include a control signal generation unit 310, a weak cell information update unit 320, an address counter 330, and a refresh address output unit 340.

The control signal generation unit 310 may count the refresh signal REF by the unit of S bits, and generate an update signal UPDATE and a comparison signal COMPARE. The update signal UPDATE is enabled each time a counting number reaches a first target value CNT(S−2). The comparison signal COMPARE is enabled each time a counting number reaches a second target value CNT(S) larger than the first target value CNT(S−2). The control signal generation unit 310 may generate the comparison signal COMPARE by masking a comparison source signal COMPARE_PRE in response to an address match signal ADD_HIT. That is, the control signal generation unit 310 may disable and output the comparison signal COMPARE when the address match signal ADD_HIT is enabled, regardless of the comparison source signal COMPARE_PRE.

The weak cell information update unit 320 may update the weak cell information INF_W in response to the update signal UPDATE, and output an updated weak cell information UPDATE_INF_W as a weak cell address WEAK_ADD<0:N> in response to the comparison signal COMPARE. In an embodiment, the weak cell information update unit 320 may output the updated weak cell information UPDATE_INF_W as the weak cell address WEAK_ADD<0:N> in response to a comparison source signal COMPARE_PRE, which corresponds to the comparison signal COMPARE before it is masked. The weak cell information INF_W may be outputted by the unit of predetermined bits from the weak cell information storage region 112, and the predetermined bits may correspond to the number of bits of the row address XADD<0:N> that is, N+1.

The address counter 330 may generate a counting address REF_CNT_ADD<0:N> by counting the refresh signal REF, and interrupt counting of the refresh signal REF in response to the comparison signal COMPARE.

The refresh address output unit 340 may output the refresh address REF_ADD<0:N> by selecting one of the weak cell address WEAK_ADD<0:N> and the counting address REF_CNT_ADD<0:N> in response to the comparison signal COMPARE. The refresh address output unit 340 may enable and output the address match signal ADD_HIT when the respective bits of the weak cell address WEAK_ADD<0:N> and the counting address REF_CNT_ADD<0:N> match each other.

Figure 4A:
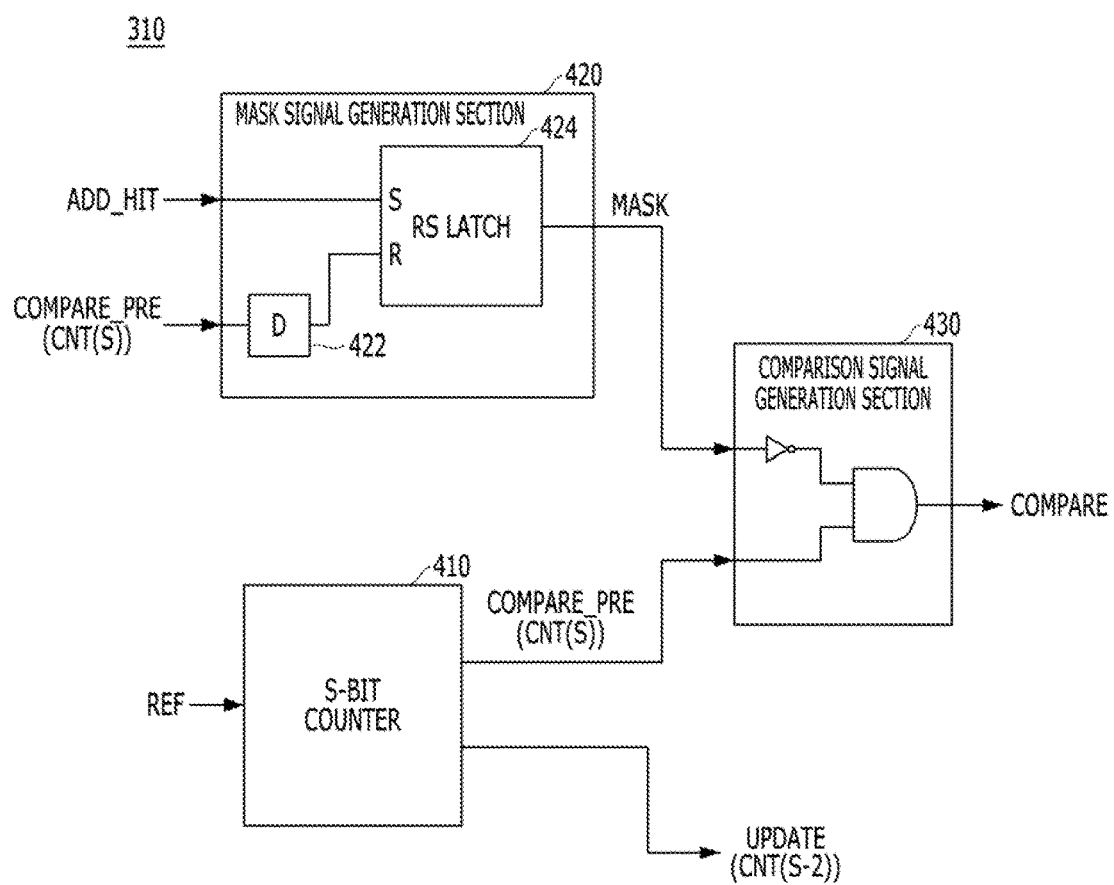
FIG. 4A is a detailed block diagram illustrating a control signal generation unit shown in FIG. 3.
Figure 4B:
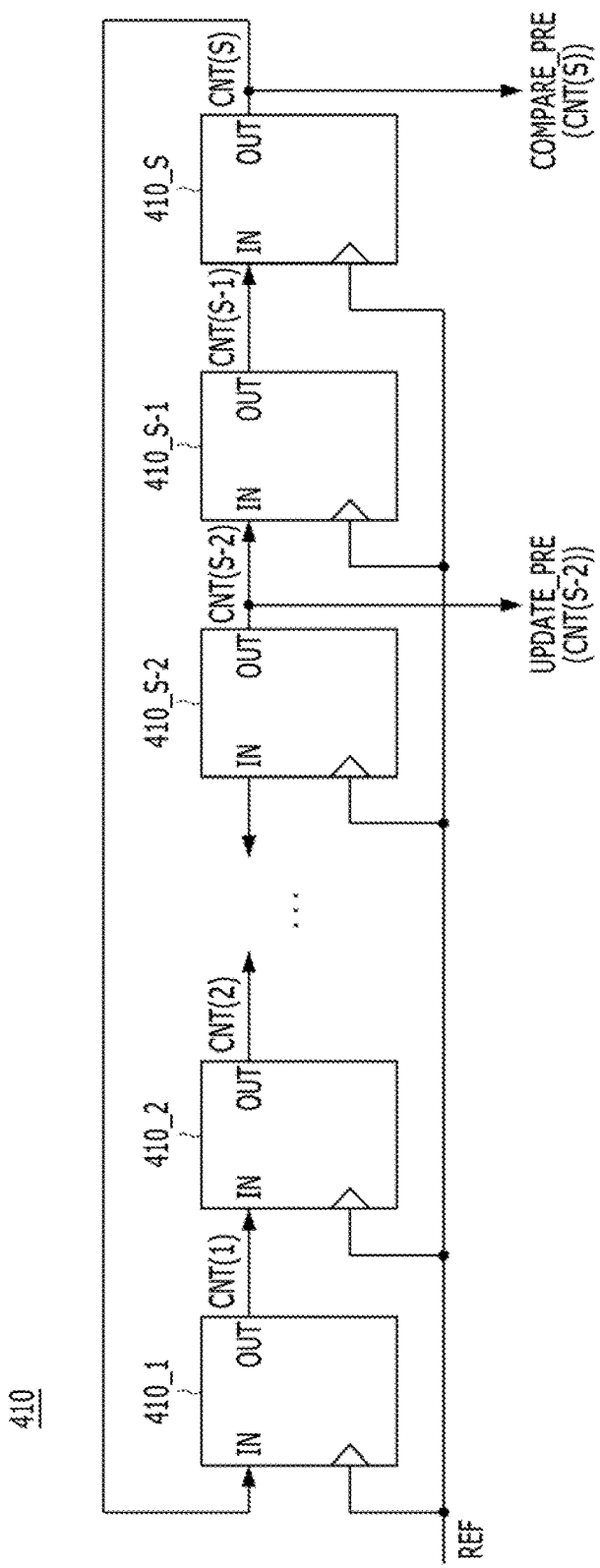
FIG. 4B is a detailed block diagram illustrating an S-bit counter shown in FIG. 4A.

FIG. 4A is a detailed block diagram illustrating the control signal generation unit 310 shown in FIG. 3. FIG. 4B is a detailed block diagram illustrating an S-bit counter 410 shown in FIG. 4A.

Referring to FIG. 4A, the control signal generation unit 310 may include an S-bit counter 410, a mask signal generation section 420, and a comparison signal generation section 430.

The S-bit counter 410 may count the refresh signal REF by the unit of S bits, and generate the update signal UPDATE and the comparison source signal COMPARE_PRE. The update signal UPDATE is enabled each time a counting number reaches the first target value CNT(S−2). The comparison source signal COMPARE_PRE is enabled each time a counting number reaches the second target value CNT(S).

Referring to FIG. 4B, the S-bit counter 410 may be constructed by S number of latches 410_1 to 410_S which are coupled in series. Each of the S number of latches 410_1 to 410_S may receive the refresh signal REF through the clock terminal thereof, and receive an output OUT of a latch of a previous stage, as an input IN. A signal CNT(S−2) of the output OUT of the latch 410_S−2 may be outputted as the update signal UPDATE, and a signal CNT(S) of the output OUT of the latch 410_S may be outputted as the comparison source signal COMPARE_PRE. While it is described exemplarily in the embodiment that the S-bit counter 410 enables a corresponding signal each time a counting number of the refresh signal REF reaches (S−2) or S, it is to be noted that a configuration which enables the update signal UPDATE in advance for a predetermined time, before the enable timing of the comparison source signal COMPARE_PRE may be implemented.

Referring again to FIG. 4A, the mask signal generation section 420 may generate a mask signal MASK in response to the address match signal ADD_HIT and the comparison source signal COMPARE_REF. The mask signal generation section 420 may enable the mask signal MASK when the address match signal ADD_HIT is enabled, and disable the mask signal MASK when a preselected time passes after the comparison source signal COMPARE_REF is enabled. In an embodiment, the mask signal generation section 420 may include a delay 422 and an RS latch 424. The delay 422 delays the comparison source signal COMPARE_PRE by a preselected time. The RS latch 424 is set in response to the address match signal ADD_HIT, is reset in response to the output of the delay 422 and outputs the mask signal MASK.

The comparison signal generation section 430 may generate the comparison signal COMPARE which is enabled in response to the comparison source signal COMPARE_PRE, when the mask signal MASK is disabled. The comparison signal generation section 430 may disable the comparison signal COMPARE when the mask signal MASK is enabled, regardless of the comparison source signal COMPARE_PRE.

As described above, the control signal generation unit 310 may count the refresh signal REF by the unit of S bits, and generate the update signal UPDATE which is enabled each time a counting number reaches the first target value CNT(S−2) and the comparison source signal COMPARE_PRE which is enabled each time a counting number reaches the second target value CNT(S) larger than the first target value CNT(S−2). If the address match signal ADD_HIT is enabled, the control signal generation unit 310 may mask the comparison source signal COMPARE_PRE and output the masked comparison source signal as the comparison signal COMPARE.

Figure 5:
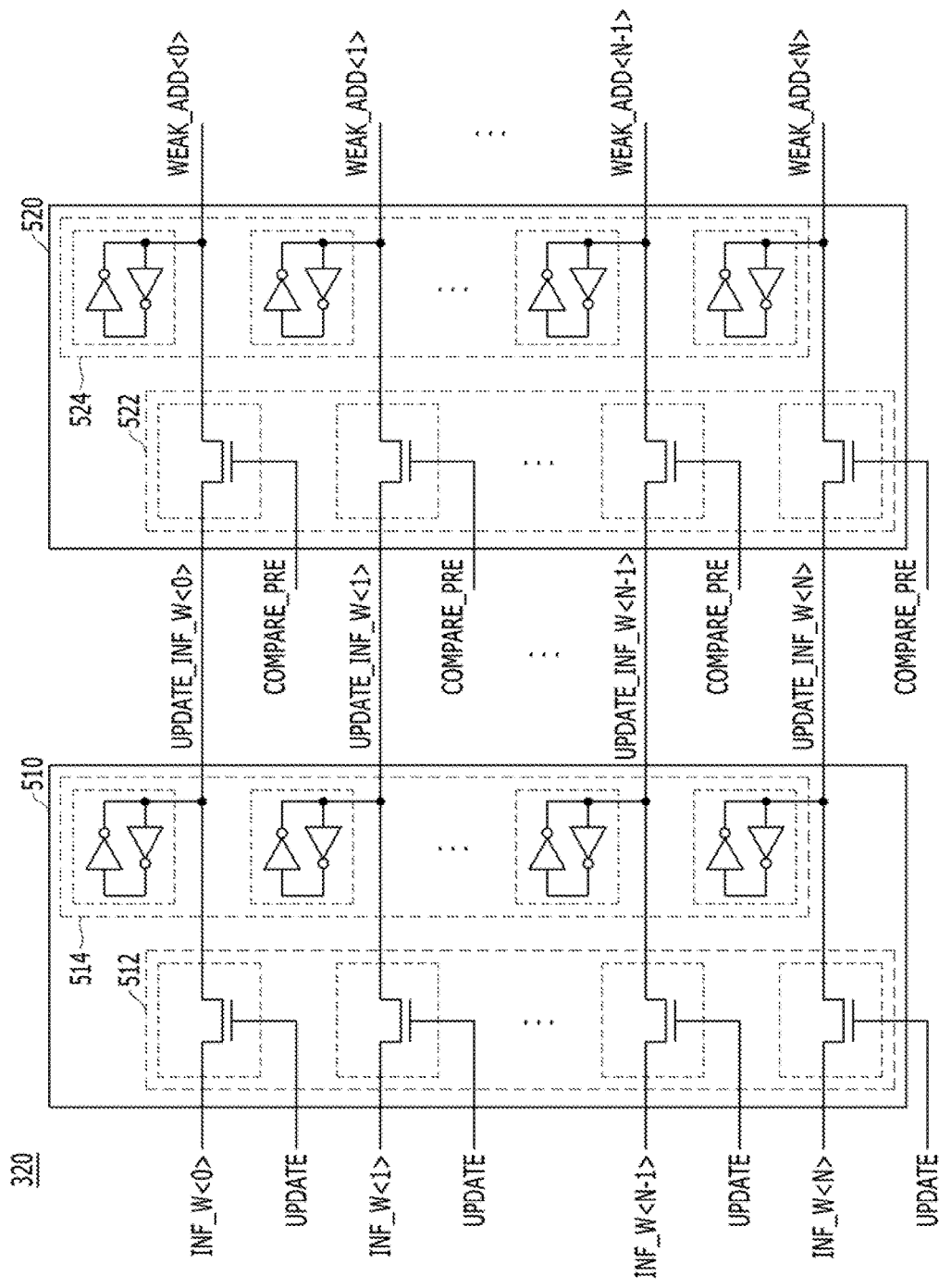
FIG. 5 is a detailed block diagram illustrating a weak cell information update unit shown in FIG. 3.

FIG. 5 is a detailed block diagram illustrating the weak cell information update unit 320 shown in FIG. 3.

Referring to FIG. 5, the weak cell information update unit 320 may include an update section 510 and an output section 520.

The update section 510 may receive and update weak cell information INF_W<0:N> which is outputted by the unit of predetermined bits, that is, by the unit of (N+1) bits, from the weak cell information storage region 112, in response to the update signal UPDATE, and store an updated weak cell information UPDATE_INF_W<0:N>. The update section 510 may include a first switch group 512 which is turned on in response to the update signal UPDATE and transfers the weak cell information INF_W<0:N>, and a first storage part 514 which stores the weak cell information INF_W<0: N> as the updated weak cell information UPDATE_INF_W<0:N>.

The output section 520 may output the updated weak cell information UPDATE_INF_W<0:N> as the weak cell address WEAK_ADD<0:N> in response to the comparison source signal COMPARE_PRE. The output section 520 may include a second switch group 522 which is turned on in response to the comparison source signal COMPARE_PRE and transfers the updated weak cell information UPDATE_INF_W<0:N>, and a second storage part 524 which stores the updated weak cell information UPDATE_INF_W<0:N> and outputs the weak cell address WEAK_ADD<0:N>.

As described above, the weak cell information update unit 320 may update the weak cell information INF_W in response to the update signal UPDATE, and output the updated weak cell information UPDATE_INF_W as the weak cell address WEAK_ADD<0:N> in response to the comparison source signal COMPARE_PRE, that is, the comparison signal COMPARE before it is masked.

Figure 6:
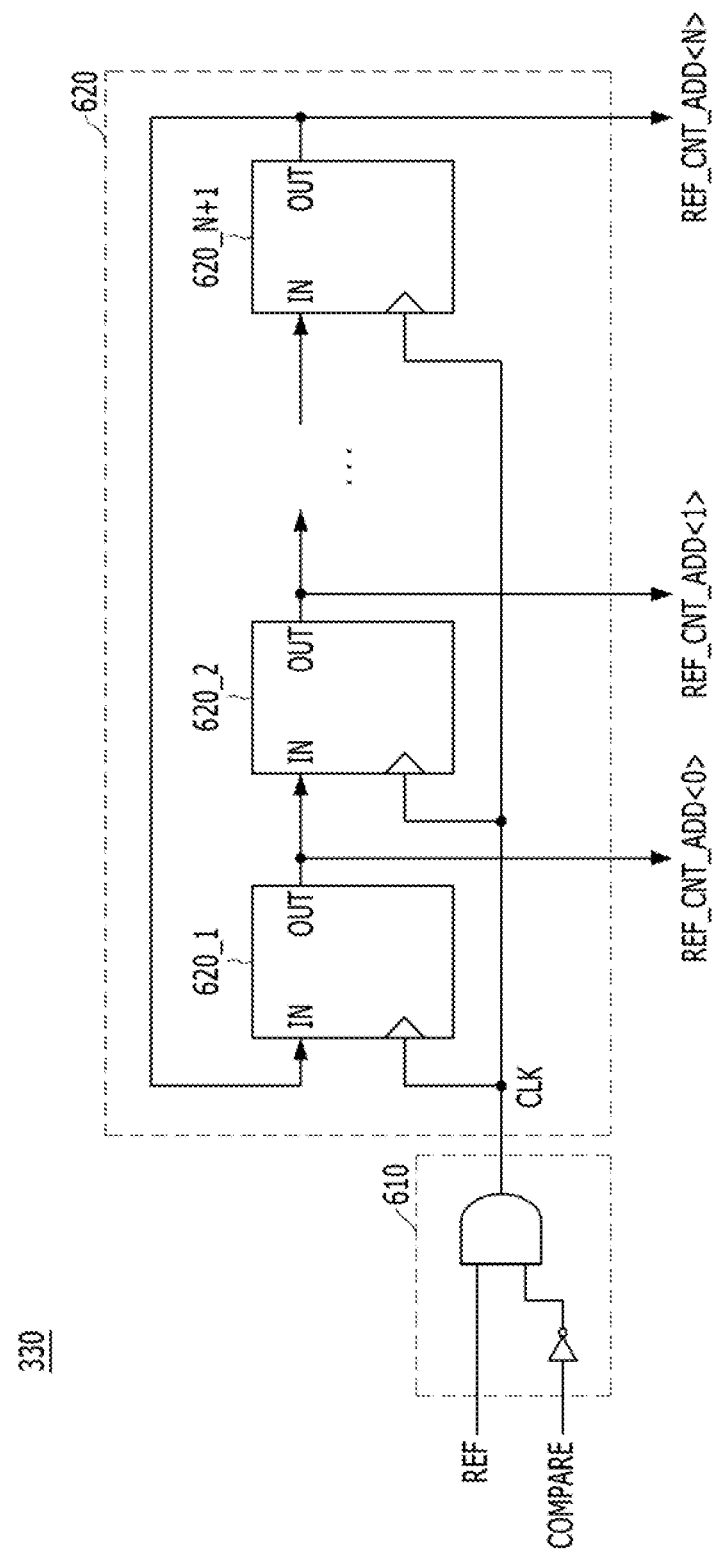
FIG. 6 is a detailed block diagram illustrating an address counter shown in FIG. 3.

FIG. 6 is a detailed block diagram illustrating the address counter 330 shown in FIG. 3.

Referring to FIG. 6, the address counter 330 may include a clock control section 610 and a counting section 620.

The clock control section 610 may generate a clock signal CLK according to the comparison signal COMPARE and the refresh signal REF. The clock control section 610 outputs the refresh signal REF as the clock signal CLK. The clock control section 610 blocks the refresh signal REF and outputs the clock signal CLK at a logic low level when the comparison signal COMPARE is enabled.

The counting section 620 may be constructed by (N+1) number of latches 620_1 to 620_N+1 which are coupled in series. Each of the (N+1) number of latches 620_1 to 620_N+1 may receive the clock signal CLK through the clock terminal thereof, and receive an output OUT of a latch of a previous stage, as an input IN. The signals of the outputs OUT of the (N+1) number of latches 620_1 to 620_N+1 may be outputted as the counting address REF_CNT_ADD<0:N>.

As described above, the address counter 330 may generate the counting address REF_CNT_ADD<0:N> by counting the refresh signal REF, and interrupt counting of the refresh signal REF in response to the comparison signal COMPARE.

Figure 7A:
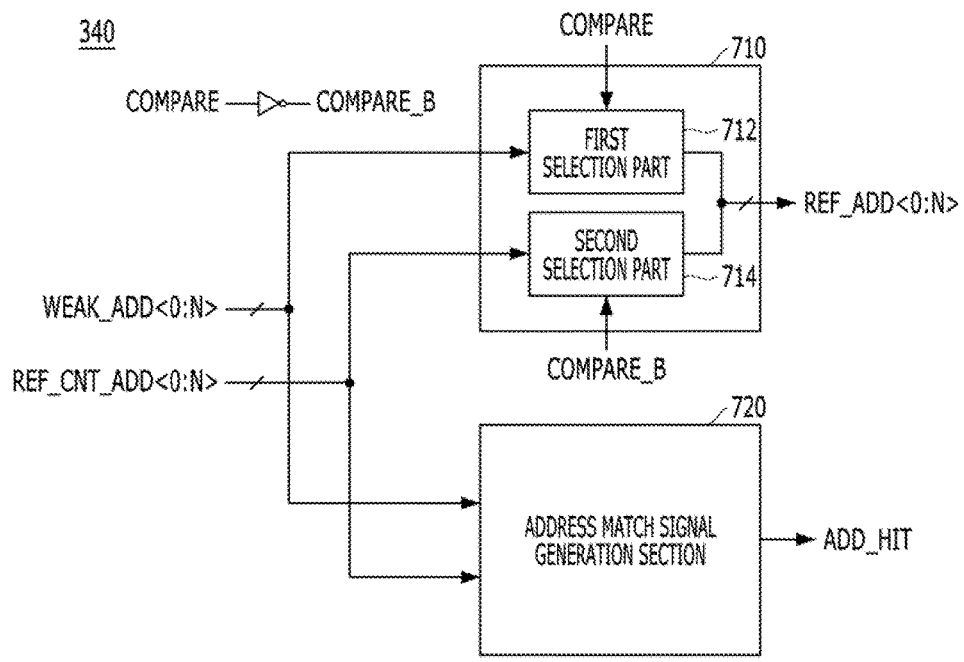
FIG. 7A is a detailed block diagram illustrating a refresh address output unit shown in FIG. 3.
Figure 7B:
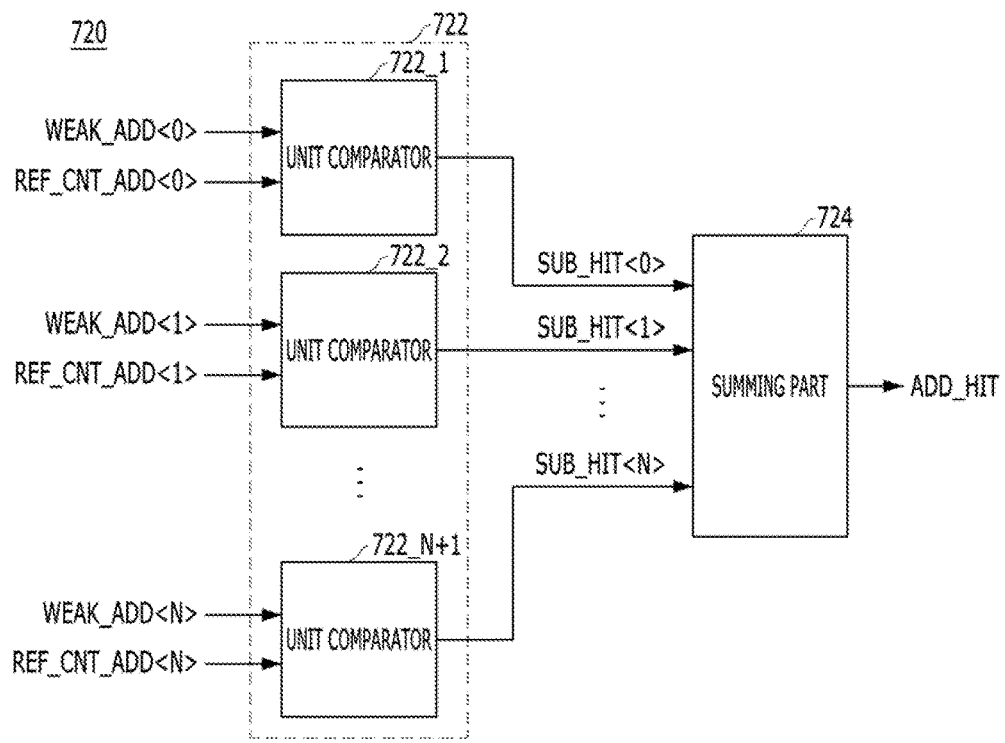
FIG. 7B is a detailed block diagram illustrating an address match signal generation section shown in FIG. 7A.

FIG. 7A is a detailed block diagram illustrating the refresh address output unit 340 shown in FIG. 3. FIG. 7B is a detailed block diagram illustrating an address match signal generation section 720 shown in FIG. 7A.

Referring to FIG. 7A, the refresh address output unit 340 may include an address selection section 710 and the address match signal generation section 720.

The address selection section 710 may output the refresh address REF_ADD<0:N> by selecting one of the weak cell address WEAK_ADD<0:N> and the counting address REF_CNT_ADD<0:N> in response to the comparison signal COMPARE. The address selection section 710 may output the weak cell address WEAK_ADD<0:N> as the refresh address REF_ADD<0:N> when the comparison signal COMPARE is enabled. The address selection section 710 may include a first selection part 712 and a second selection part 714. The first selection part 712 outputs the weak cell address WEAK_ADD<0:N> as the refresh address REF_ADD<0:N> in response to the comparison signal COMPARE. The second selection part 714 outputs the counting address REF_CNT_ADD<0:N> as the refresh address REF_ADD<0:N> in response to an inverted comparison signal COMPARE_B.

The address match signal generation section 720 may enable and output the address match signal ADD_HIT when the respective bits of the weak cell address WEAK_ADD<0:N> and the counting address REF_CNT_ADD<0:N> match each other.

Referring to FIG. 7B, the address match signal generation section 720 may include a comparison part 722 and a summing part 724. The comparison part 722 includes a plurality of unit comparators 722_1 to 722_N+1 which compare the respective bits of the weak cell address WEAK_ADD<0:N> and the counting address REF_CNT_ADD<0:N>. The summing part 724 sums outputs SUM_HIT<0:N> of the plurality of unit comparators 722_1 to 722_N+1 and generates the summing result for the outputs SUM_HIT<0:N> as the address match signal ADD_HIT.

As described above, the refresh address output unit 340 may output the refresh address REF_ADD<0:N> by selecting one of the weak cell address WEAK_ADD<0:N> and the counting address REF_CNT_ADD<0:N> in response to the comparison signal COMPARE. The refresh address output unit 340 may enable and output the address match signal ADD_HIT when the respective bits of the weak cell address WEAK_ADD<0:N> and the counting address REF_CNT_ADD<0:N> match each other.

Hereinbelow, with reference to drawings, descriptions will be made for a method in which, after storing a weak cell information in a partial region for example, a dummy cell region, in a memory array region, a refresh operation is selectively performed by using the stored weak cell information.

Figure 8A:
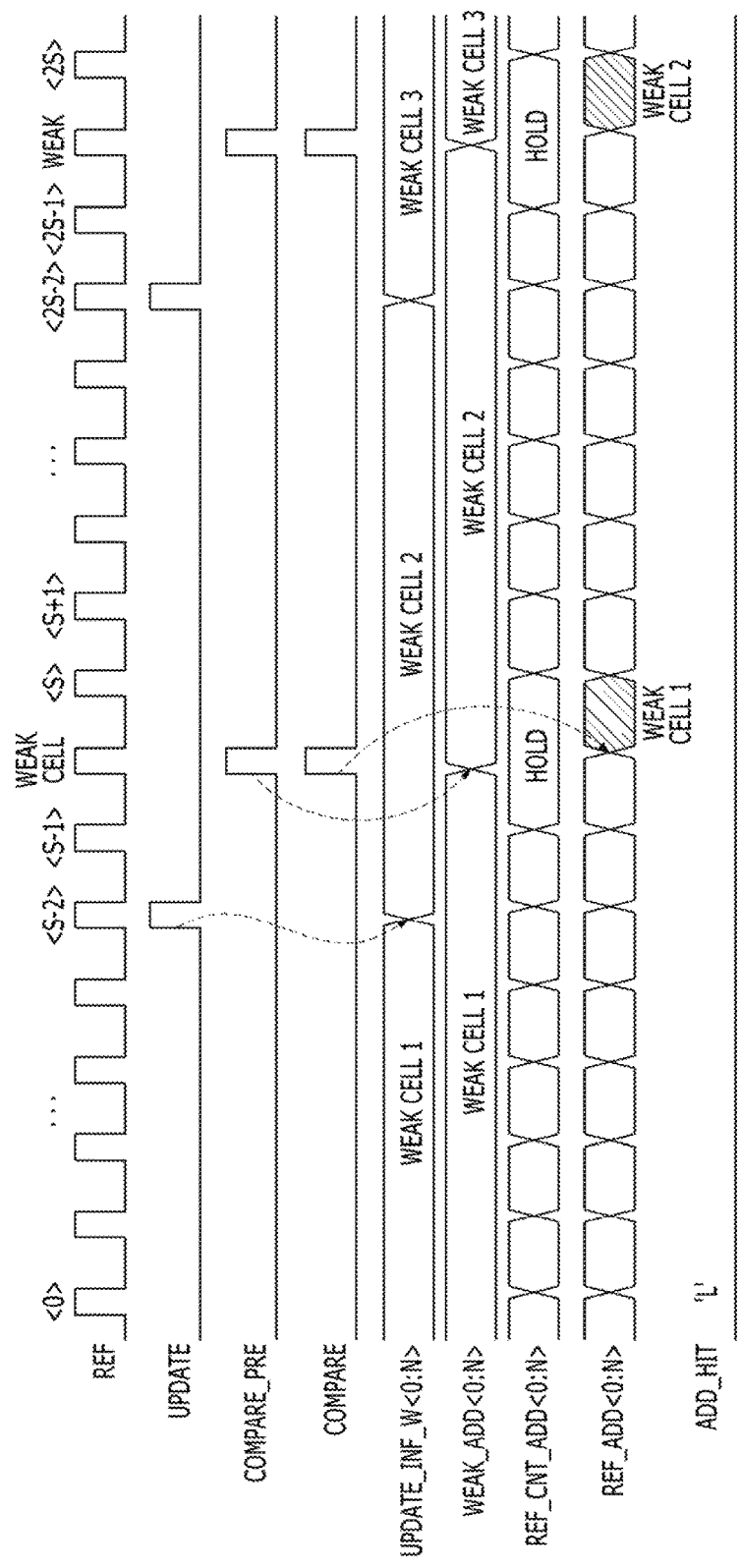
FIGS. 8A to 8C are operation waveform diagrams of the refresh address generation block shown in FIG. 2.
Figure 8B:
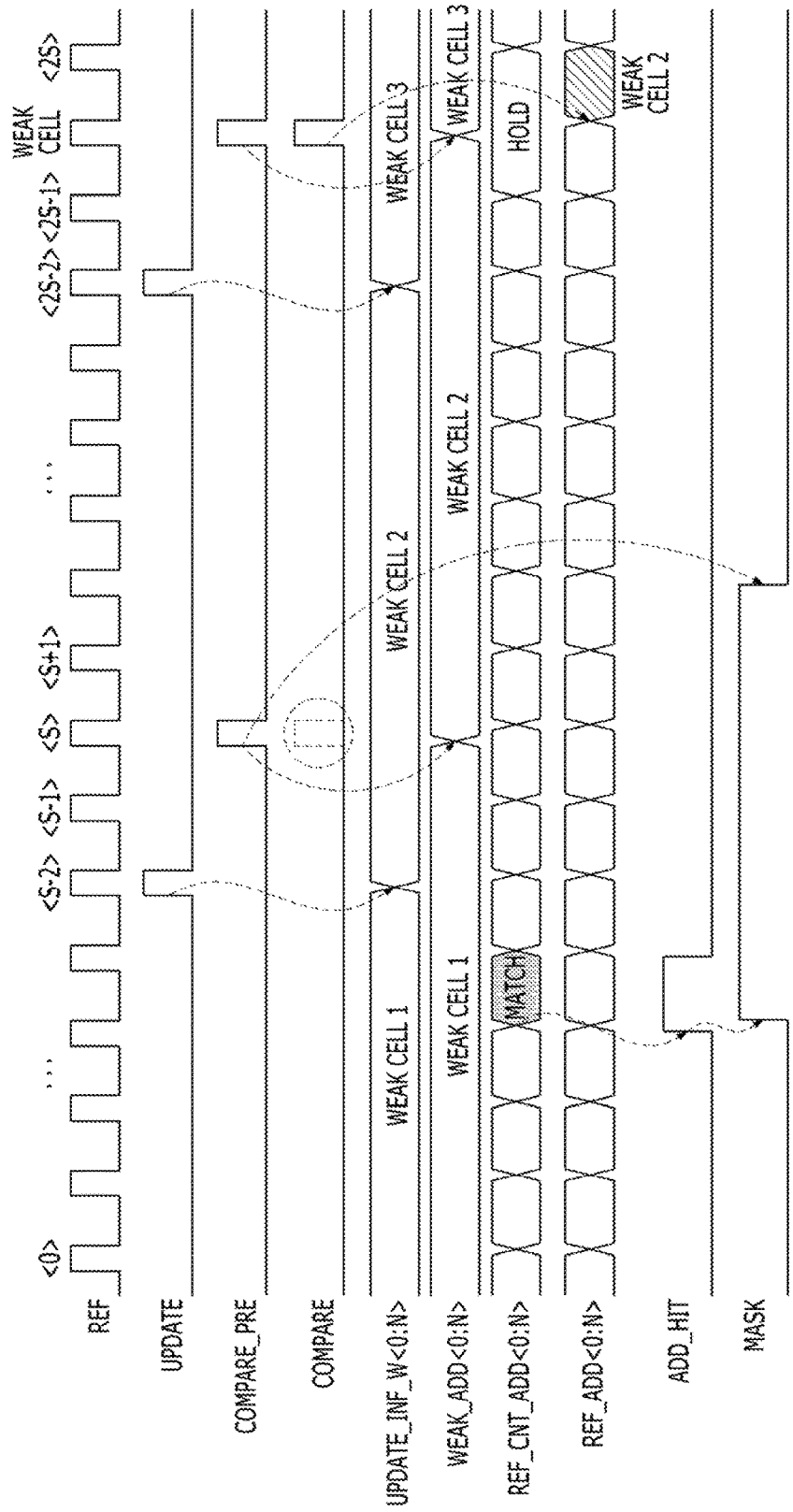
Figure 8C:
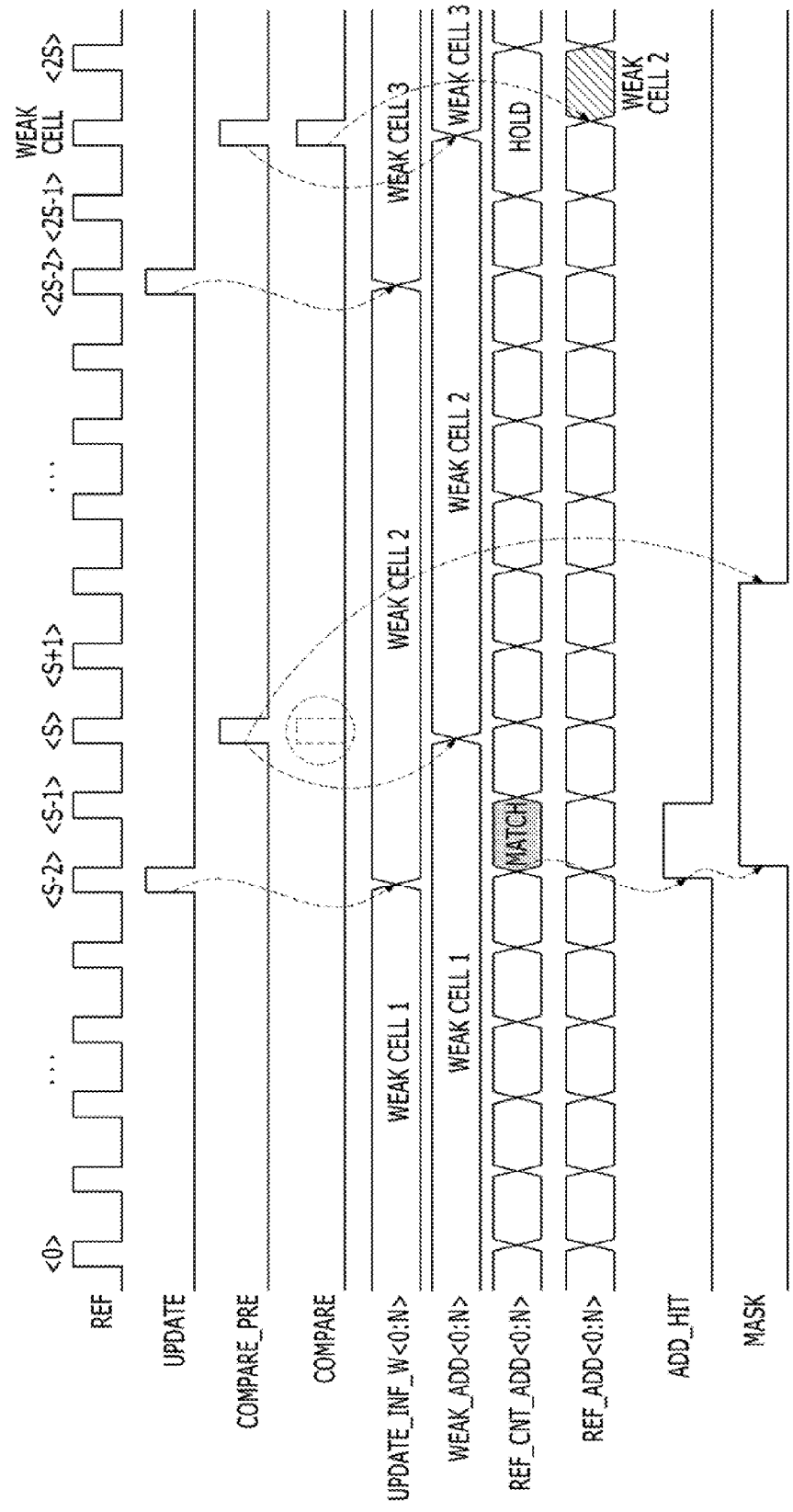
Figure 9A:
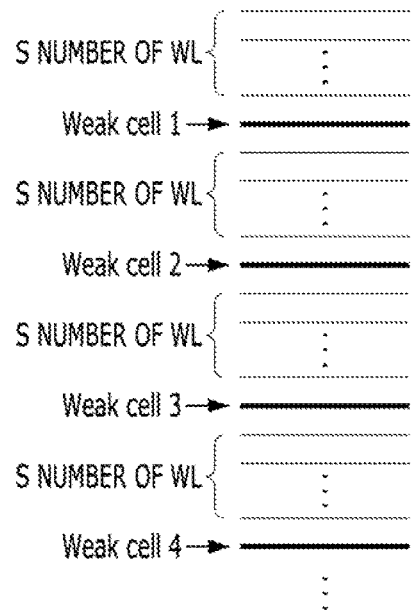
FIGS. 9A to 9C are diagrams illustrating refresh operations of FIGS. 8A to 8C, respectively.
Figure 9B:
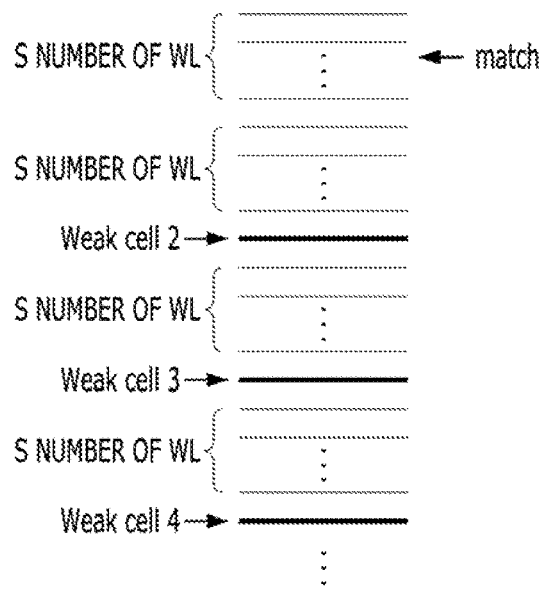
Figure 9C:
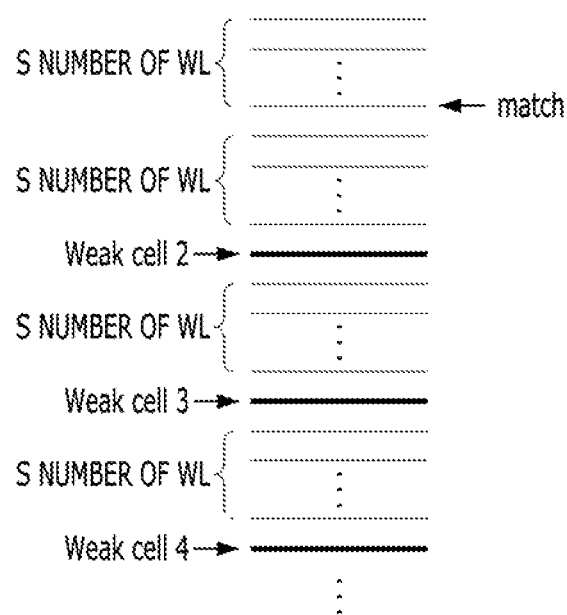

FIGS. 8A to 8C are operation waveform diagrams of the refresh address generation block 210 shown in FIG. 2. FIGS. 9A to 9C are diagrams illustrating refresh operations of FIGS. 8A to 8C, respectively.

FIGS. 8A and 9A are drawings illustrating a case in which the address match signal ADD_HIT is disabled. FIGS. 8B and 9B are drawings illustrating a first case in which the address match signal ADD_HIT is enabled before the enable timings of the update signal UPDATE and the comparison signal COMPARE. FIGS. 8C and 9C are drawings illustrating a second case in which the address match signal ADD_HIT is enabled between the enable timings of the update signal UPDATE and the comparison signal COMPARE.

Referring to FIG. 8A, in a refresh operation, the address counter 330 of the refresh address generation block 210 generates the counting address REF_CNT_ADD<0:N> by counting the refresh signal REF which toggles with the predetermined cycle. The refresh address output unit 340 outputs the counting address REF_CNT_ADD<0:N> as the refresh address REF_ADD<0:N> in response to the comparison signal COMPARE which is disabled. Therefore, a refresh operation, that is, a normal refresh operation, may be performed sequentially for S number of word lines WL.

The control signal generation unit 310 counts the refresh signal REF by the unit of S bits, enables the update signal UPDATE each time a counting number reaches the first target value CNT(S−2), and enables the comparison signal COMPARE each time a counting number reaches the second target value CNT(S). In response to the comparison signal COMPARE which is enabled, the address counter 330 may interrupt counting of the refresh signal REF, and the refresh address output unit 340 may output the weak cell address WEAK_ADD<0:N> for a first weak cell WEAK CELL 1, as the refresh address REF_ADD<0:N>.

Accordingly, after the normal refresh operation is performed sequentially for the S number of word lines WL, a refresh operation, that is, a weak cell refresh operation, may be performed for the word line of the first weak cell WEAK CELL 1.

The weak cell information update unit 320 updates the weak cell information INF_W<0:N> for the first weak cell WEAK CELL 1, with the weak cell information INF_W<0:N> for a second weak cell WEAK CELL 2, in response to the update signal UPDATE which is enabled, and outputs the updated weak cell information UPDATE_INF_W<0:N> as the weak cell address WEAK_ADD<0:N> in response to the comparison source signal COMPARE_PRE which is enabled.

Therefore, referring to FIG. 9A, an operation, in which, after the normal refresh operation is performed sequentially for the S number of word lines according to the counting address REF_CNT_ADD<0:N>, the weak cell refresh operation is performed for a word line corresponding to the weak cell address WEAK_ADD<0:N>, may be performed repeatedly.

Referring to FIGS. 8B and 8C, in a refresh operation, the address counter 330 generates the counting address REF_CNT_ADD<0:N>, and the refresh address output unit 340 outputs the counting address REF_CNT_ADD<0:N> as the refresh address REF_ADD<0:N> in response to the comparison signal COMPARE which is disabled. Therefore, a normal refresh operation may be performed sequentially for S number of word lines WL.

The refresh address output unit 340 may enable and output the address match signal ADD_HIT when the respective bits of the weak cell address WEAK_ADD<0:N> and the counting address REF_CNT_ADD<0:N> match each other. When the address match signal ADD_HIT is enabled before the enable timings of the update signal UPDATE and the comparison signal COMPARE or in when the address match signal ADD_HIT is enabled between the enable timings of the update signal UPDATE and the comparison signal COMPARE, the mask signal generation section 420 of the control signal generation unit 310 enables the mask signal MASK according to the address match signal ADD_HIT which is enabled, and the comparison signal generation section 430 disables and outputs the comparison signal COMPARE according to the mask signal MASK which is enabled.

The weak cell information update unit 320 updates the weak cell information INF_W<0:N> for a first weak cell WEAK CELL 1, with the weak cell information INF_W<0:N> for a second weak cell WEAK CELL 2, in response to the update signal UPDATE which is enabled. Then, the weak cell information update unit 320 outputs the updated weak cell information UPDATE_INF_W<0:N> as the weak cell address WEAK_ADD<0:N> in response to the comparison source signal COMPARE_PRE which is enabled. At this time, since the comparison signal COMPARE is disabled, the address counter 330 does not interrupt counting of the refresh signal REF and continuously outputs the counting address REF_CNT_ADD<0:N>, and the refresh address output unit 340 outputs the counting address REF_CNT_ADD<0:N> as the refresh address REF_ADD<0:N>. Therefore, a normal refresh operation may be performed sequentially for the next S number of word lines WL.

Thereafter, the control signal generation unit 310 enables the update signal UPDATE when a counting number of the refresh signal REF reaches the first target value CNT(S−2), and enables the comparison signal COMPARE when a counting number of the refresh signal REF reaches the second target value CNT(S). In response to the comparison signal COMPARE which is enabled, the address counter 330 may interrupt counting of the refresh signal REF, and the refresh address output unit 340 may output the weak cell address WEAK_ADD<0:N> for the second weak cell WEAK CELL 2, as the refresh address REF_ADD<0:N>. Therefore, a weak cell refresh operation may be performed for the word line of the second weak cell WEAK CELL 2.

The weak cell information update unit 320 updates the weak cell information INF_W<0:N> for the second weak cell WEAK CELL 2, with the weak cell information INF_W<0:N> for a third weak cell WEAK CELL 3, in response to the update signal UPDATE which is enabled. Then, the weak cell information update unit 320 outputs the updated weak cell information UPDATE_INF_W<0:N> as the weak cell address WEAK_ADD<0:N> in response to the comparison source signal COMPARE_PRE which is enabled.

Therefore, referring to FIGS. 9B and 9C, when one among S number of word lines WL for which a refresh operation is performed is identical to a word line corresponding to the weak cell address WEAK_ADD<0:N>, after a normal refresh operation is performed sequentially for the S number of word lines WL and the next S number of word lines WL according to the counting address REF_CNT_ADD<0:N>, a weak cell refresh operation for a word line corresponding to the corresponding weak cell address WEAK_ADD<0:N> for example, the address of the first weak cell WEAK CELL 1 is omitted, and a weak cell refresh operation for a word line corresponding to the next weak cell address WEAK_ADD<0:N> for example, the address of the second weak cell WEAK CELL 2 may be performed. As a consequence, since a refresh operation for a word line corresponding to an overlapping weak cell address may be omitted, the amount of current consumed due to an entire refresh operation may be reduced.

As is apparent from the above descriptions, according to the embodiment of the present disclosure, since a weak cell information is transmitted from a weak cell storage circuit to a memory array region in a boot-up operation and a refresh operation is performed through controlling a refresh cycle by using the weak cell information stored in the memory array region, the amount of current consumed due to the refresh operation may be reduced and the reliability of a chip may be improved. Furthermore, by using a dummy mat or a dummy cell region provided in the memory array region 110 as the weak cell information storage region 112, the areas of storage circuits such as existing latches and the areas of circuits for generating control signals associated therewith may be reduced.

Although it was described above with reference to FIGS. 3 to 9C that a refresh operation is performed in such a manner that a normal refresh operation is performed sequentially for S number of word lines WL and then, in response to enablement of a comparison signal COMPARE, counting of a refresh signal REF is interrupted and a weak cell refresh operation is performed, it is to be noted that the present disclosure is not limited thereto. Hereinbelow, descriptions will be made for a refresh operation that is performed in such a manner that, while performing a normal refresh operation sequentially for S number of word lines WL, a weak cell refresh operation is performed without interrupting counting of a refresh signal REF.

Figure 10:
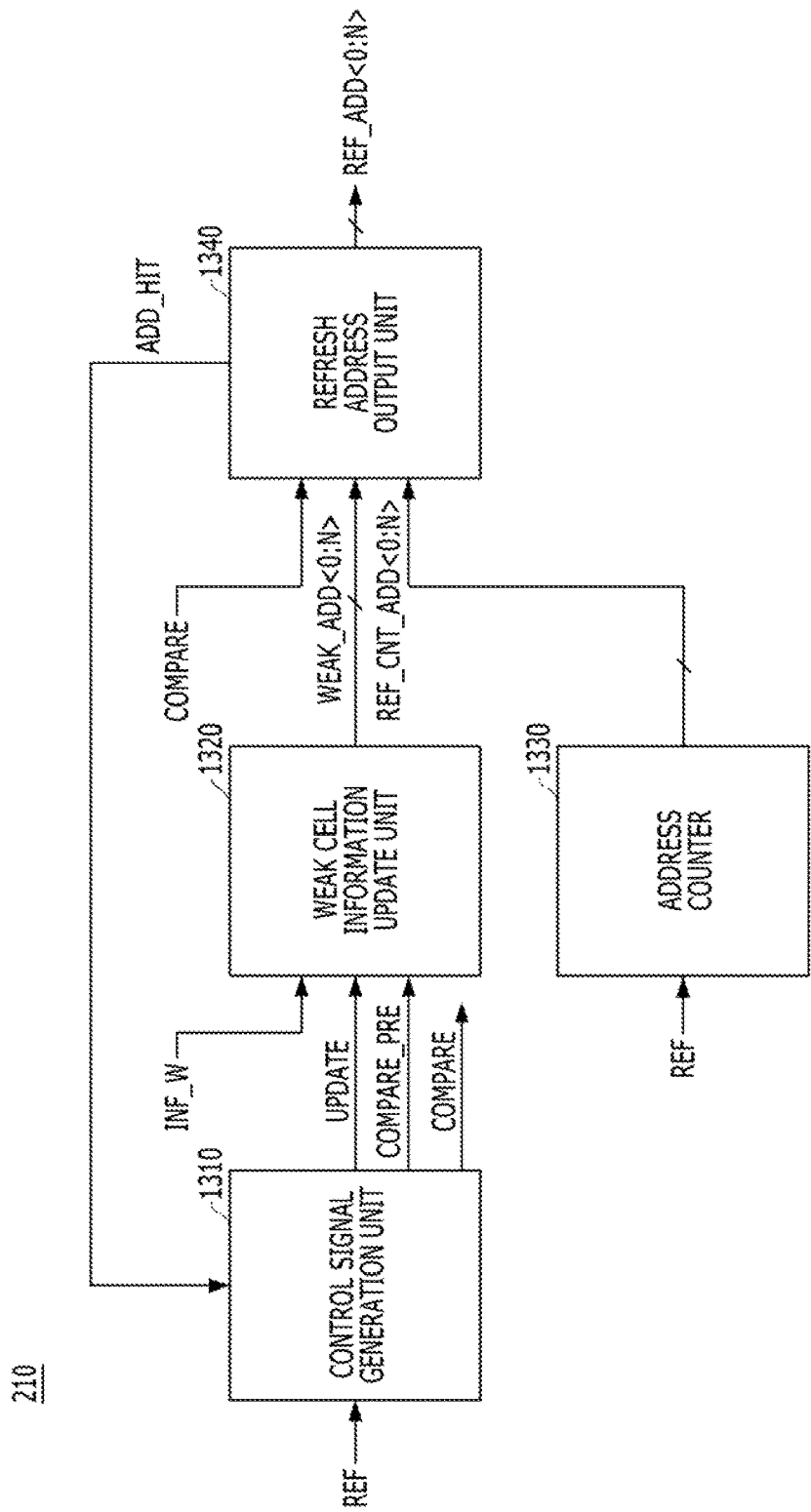
FIG. 10 is a detailed block diagram illustrating a refresh address generation block shown in FIG. 2 in accordance with another embodiment of the present invention.

FIG. 10 is a detailed block diagram illustrating the refresh address generation block 210 shown in FIG. 2 in accordance with another embodiment of the present invention.

Referring to FIG. 10, the refresh address generation block 210 may include a control signal generation unit 1310, a weak cell information update unit 1320, an address counter 1330, and a refresh address output unit 1340.

Since the detailed configurations of the control signal generation unit 1310, the weak cell information update unit 1320 and the refresh address output unit 1340 shown in FIG. 10 are substantially the same as those of the control signal generation unit 310, the weak cell information update unit 320 and the refresh address output unit 340 shown in FIG. 2, repeated descriptions thereof will be omitted herein.

Unlike the address counter 330 of FIG. 2, the address counter 1330 of FIG. 10 is not inputted with a comparison signal COMPARE. That is, the address counter 1330 of FIG. 10 may generate a counting address REF_CNT_ADD<0:N> by counting a refresh signal REF. Similar to the address counter 330 in FIG. 6, the address counter 1330 may be constructed by (N+1) number of latches (not shown) which receive the refresh signal REF through the clock terminals thereof, receive outputs OUT of latches of previous stages, as inputs IN, and finally output the counting address REF_CNT_ADD<0:N>.

Thus, the address counter 1330 of FIG. 10 may output the counting address REF_CNT_ADD<0:N> generated by counting the refresh signal REF which toggles with a predetermined cycle, as a refresh address REF_ADD<0:N>, and the refresh address output unit 1340 may output a weak cell address WEAK_ADD<0:N> as the refresh address REF_ADD<0:N> according to the comparison signal COMPARE which is enabled with a preselected cycle.

Figure 11A:
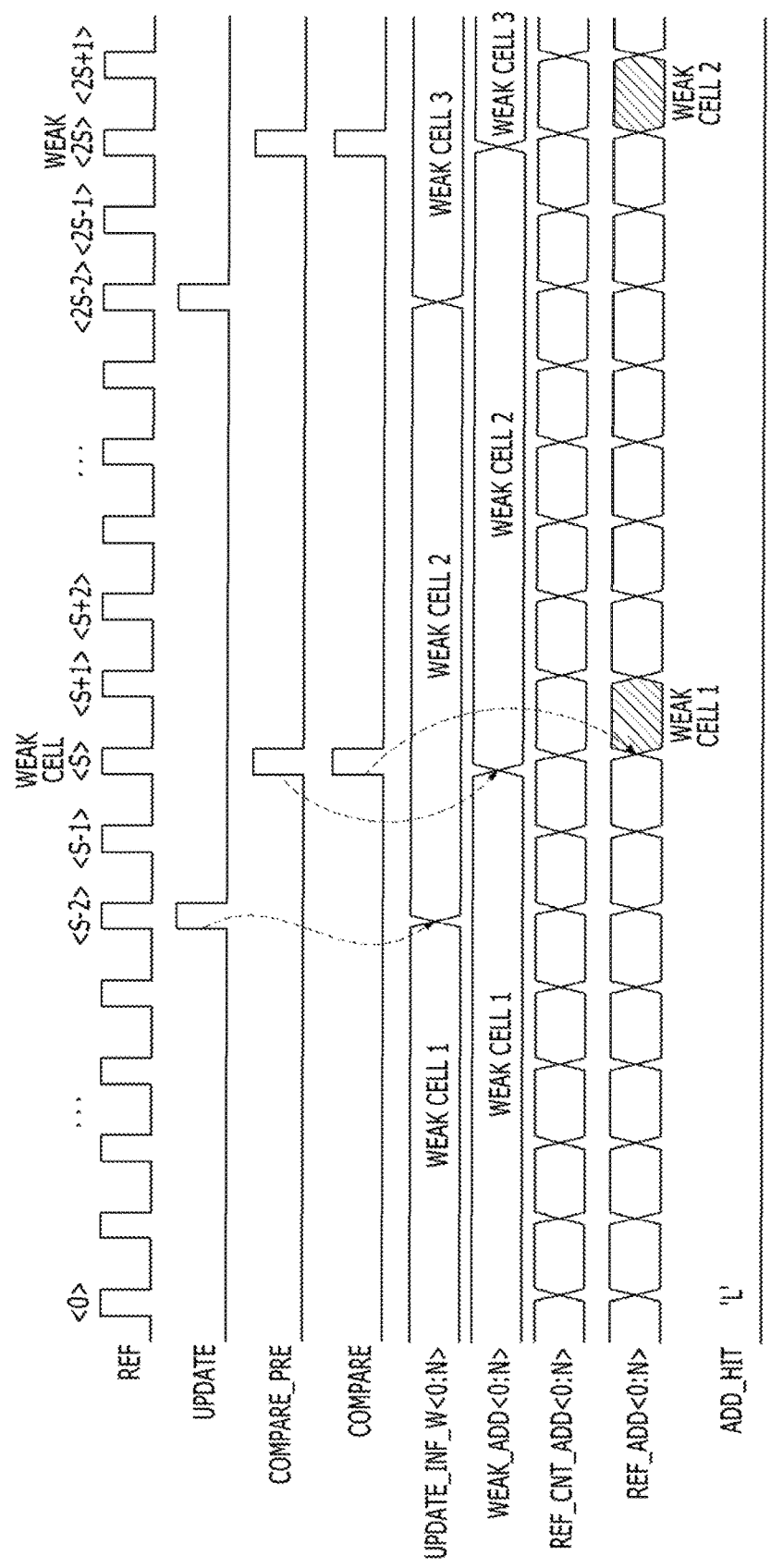
FIGS. 11A and 11B are operation waveform diagrams of the refresh address generation block shown in FIG. 10.
Figure 11B:
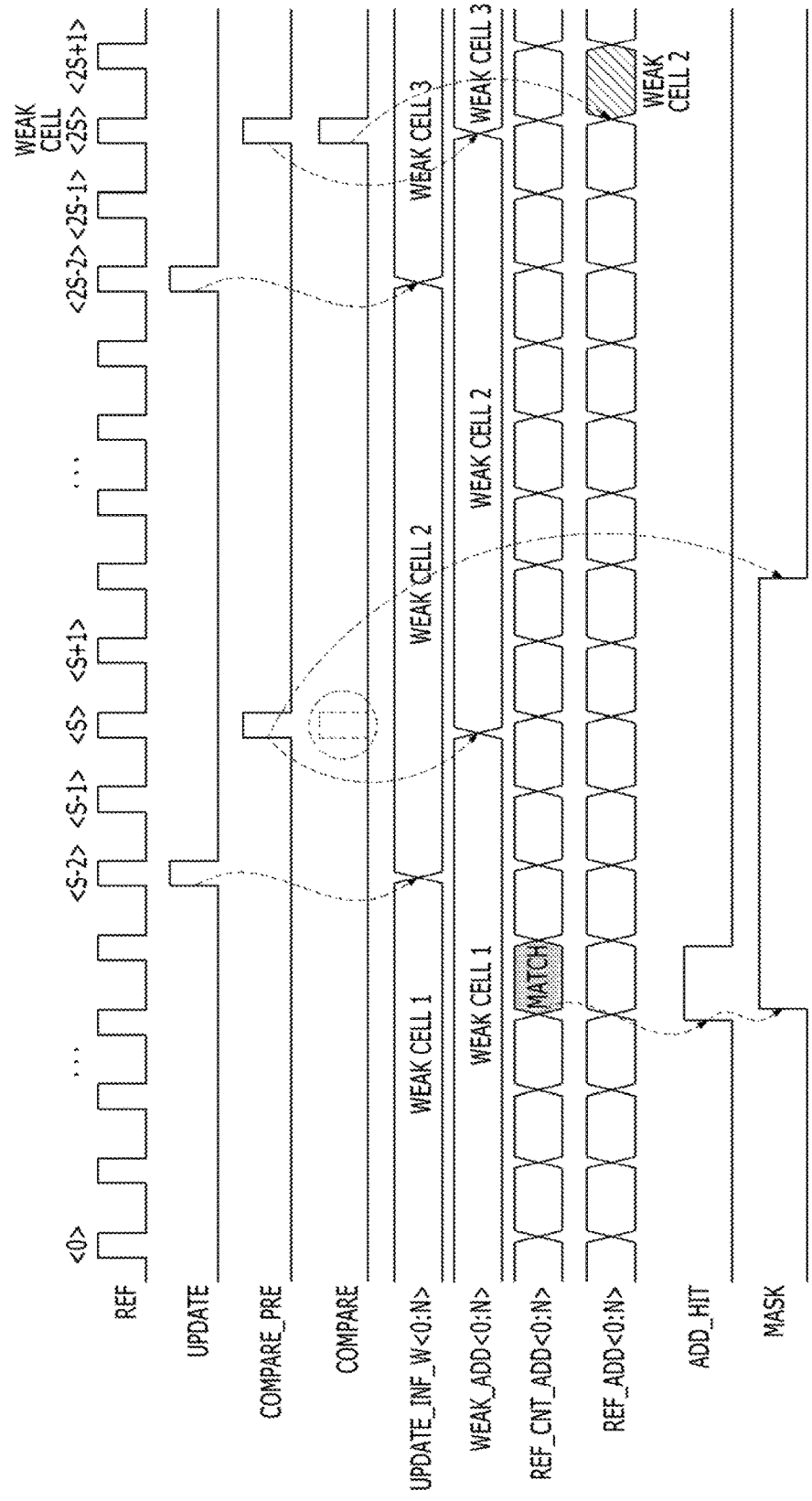
Figure 12A:
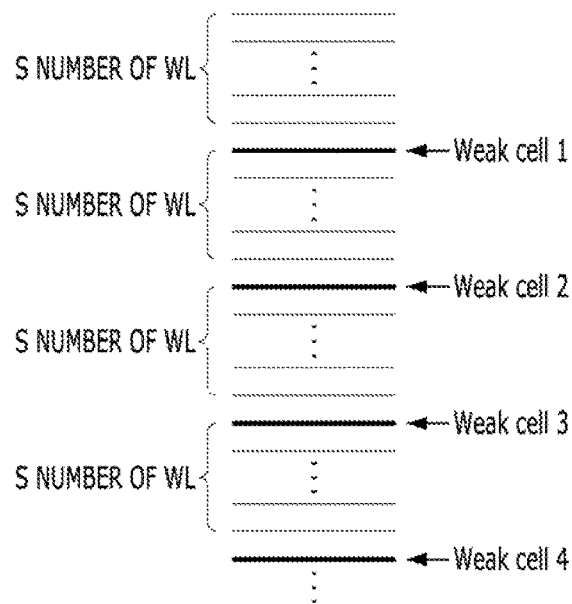
FIGS. 12A and 12B are diagrams illustrating refresh operations of FIGS. 11A and 11B, respectively.
Figure 12B:
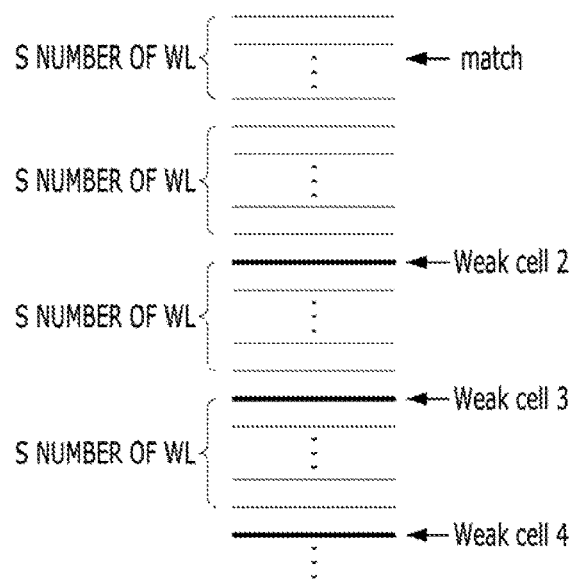

FIGS. 11A and 11B are operation waveform diagrams of the refresh address generation block 210 shown in FIG. 10. FIGS. 12A and 12B are diagrams illustrating refresh operations of FIGS. 11A and 11B, respectively.

FIGS. 11A and 12A are drawings illustrating a case in which an address match signal ADD_HIT is disabled, FIGS. 11B and 12B are drawings illustrating a case in which the address match signal ADD_HIT is enabled.

Referring to FIG. 11A, in a refresh operation, the address counter 1330 generates the counting address REF_CNT_ADD<0:N> by counting the refresh signal REF which toggles with the predetermined cycle. The refresh address output unit 1340 outputs the counting address REF_CNT_ADD<0:N> as the refresh address REF_ADD<0:N> in response to the comparison signal COMPARE which is disabled. Therefore, a refresh operation, that is, a normal refresh operation, may be performed sequentially for S number of word lines WL.

The control signal generation unit 1310 counts the refresh signal REF by the unit of S bits, enables an update signal UPDATE each time a counting number reaches a first target value CNT(S−2), and enables the comparison signal COMPARE each time a counting number reaches a second target value CNT(S). In response to the comparison signal COMPARE which is enabled, the refresh address output unit 1340 may output the weak cell address WEAK_ADD<0:N> for a first weak cell WEAK CELL 1, as the refresh address REF_ADD<0:N>. Accordingly, after the normal refresh operation is performed sequentially for the S number of word lines WL, a refresh operation, that is, a weak cell refresh operation, may be performed for the word line of the first weak cell WEAK CELL 1. At this time, since the address counter 1330 continuously performs a counting operation while the weak cell refresh operation is performed, a normal refresh operation for a word line next to the S number of word lines WL, that is, an (S+1)ˆth word line, may be omitted.

The weak cell information update unit 1320 updates a weak cell information INF_W<0:N> for the first weak cell WEAK CELL 1, with the weak cell information INF_W<0:N> for a second weak cell WEAK CELL 2, in response to the update signal UPDATE which is enabled. Then, the weak cell information update unit 1320 outputs an updated weak cell information UPDATE_INF_W<0:N> as the weak cell address WEAK_ADD<0:N> in response to a comparison source signal COMPARE_PRE which is enabled.

Therefore, referring to FIG. 12A, an operation, in which, after the normal refresh operation is performed sequentially for the S number of word lines according to the counting address REF_CNT_ADD<0:N>, the weak cell refresh operation is performed for a word line corresponding to the weak cell address WEAK_ADD<0:N>, may be performed repeatedly. At this time, since the address counter 1330 continuously performs a counting operation while the weak cell refresh operation is performed, a normal refresh operation for a word line next to the S number of word lines WL may be omitted.

Referring to FIG. 11B, in a refresh operation, the address counter 1330 generates the counting address REF_CNT_ADD<0:N>, and the refresh address output unit 1340 outputs the counting address REF_CNT_ADD<0:N> as the refresh address REF_ADD<0:N> in response to the comparison signal COMPARE which is disabled.

Therefore, a normal refresh operation may be performed sequentially for S number of word lines WL.

The refresh address output unit 1340 may enable and output the address match signal ADD_HIT when the respective bits of the weak cell address WEAK_ADD<0:N> and the counting address REF_CNT_ADD<0:N> match each other. The control signal generation unit 1310 disables and outputs the comparison signal COMPARE according to the address match signal ADD_HIT which is enabled.

The weak cell information update unit 1320 updates the weak cell information INF_W<0:N> for a first weak cell WEAK CELL 1, with the weak cell information INF_W<0:N> for a second weak cell WEAK CELL 2, in response to the update signal UPDATE which is enabled, and outputs the updated weak cell information UPDATE_INF_W<0:N> as the weak cell address WEAK_ADD<0:N> in response to the comparison source signal COMPARE_PRE which is enabled. The refresh address output unit 1340 outputs the counting address REF_CNT_ADD<0:N> as the refresh address REF_ADD<0:N> in response to the comparison signal COMPARE which is disabled. Therefore, a normal refresh operation may be performed sequentially for the next S number of word lines WL.

Thereafter, the control signal generation unit 1310 enables the update signal UPDATE when a counting number of the refresh signal REF reaches the first target value CNT(S−2), and enables the comparison signal COMPARE when a counting number of the refresh signal REF reaches the second target value CNT(S). In response to the comparison signal COMPARE which is enabled, the refresh address output unit 1340 may output the weak cell address WEAK_ADD<0:N> for the second weak cell WEAK CELL 2, as the refresh address REF_ADD<0:N>. Therefore, a weak cell refresh operation may be performed for the word line of the second weak cell WEAK CELL 2. At this time, since the address counter 1330 continuously performs a counting operation while the weak cell refresh operation is performed, a normal refresh operation for a word line next to the 2S number of word lines WL, that is, a (2S+1)ˆth word line, may be omitted.

Therefore, referring to FIG. 12B, when one among S number of word lines WL for which a refresh operation is performed is identical to a word line corresponding to the weak cell address WEAK_ADD<0:N>, a normal refresh operation is performed sequentially for the S number of word lines WL and the next S number of word lines WL according to the counting address REF_CNT_ADD<0:N>. Thereafter, a weak cell refresh operation for a word line corresponding to the address of the first weak cell WEAK CELL 1 may be omitted, and a weak cell refresh operation for a word line corresponding to the address of the second weak cell WEAK CELL 2 may be performed. At this time, since the address counter 1330 continuously performs a counting operation while the weak cell refresh operation is performed, a normal refresh operation for a word line next to the 2S number of word lines WL may be omitted.

Although various embodiments have been described for illustrative purposes, it will be apparent to those skilled in the art that various changes and modifications may be made without departing from the spirit and scope of the invention as defined in the following claims.

For example, positions and types of the logic gates and transistors described as an example in the above embodiment can be differently realized according to the polarities of the signals inputted thereto.

What is claimed is:

1. A semiconductor memory device comprising:
a weak cell storage circuit suitable for programming therein a weak cell information, and outputting the weak cell information in an initialization operation;
a cell array region including a first cell region which stores the weak cell information received from the weak cell storage circuit in the initialization operation;
a refresh address generation block suitable for generating a refresh address by counting a refresh signal, and outputting a weak cell address corresponding to the weak cell information outputted from the first cell region, as the refresh address, with a predetermined cycle; and
a refresh circuit suitable for performing a refresh operation for a word line corresponding to the refresh address, among a plurality of word lines.

2. The semiconductor memory device according to claim 1, wherein the refresh address generation block repeatedly performs successively outputting refresh addresses corresponding to a predetermined number of word lines by counting the refresh signal, and outputting the weak cell address as the refresh address.

3. The semiconductor memory device according to claim 1, wherein the refresh address generation block repeatedly performs successively outputting refresh addresses corresponding to a predetermined number of word lines by counting the refresh signal, interrupting the counting and outputting the weak cell address as the refresh address.

4. The semiconductor memory device according to claim 3, wherein, when one of the refresh addresses corresponding to the predetermined number of word lines is identical to the weak cell address, the refresh address generation block omits outputting of the weak cell address as the refresh address, and successively outputs refresh addresses corresponding to a next predetermined number of word lines by counting the refresh signal.

5. The semiconductor memory device according to claim 1, wherein the refresh address generation block comprises:
a control signal generation unit suitable for counting the refresh signal by an unit of S bits, and generating an update signal which is enabled each time a counting number reaches a first target value and a comparison signal which is enabled each time a counting number reaches a second target value larger than the first target value;
a weak cell information update unit suitable for updating the weak cell information in response to the update signal, and outputting an updated weak cell information as the weak cell address based on the comparison signal;
an address counter suitable for generating a counting address by counting the refresh signal, and interrupting counting of the refresh signal in response to the comparison signal; and
a refresh address output unit suitable for outputting the refresh address by selecting one of the weak cell address and the counting address in response to the comparison signal.

6. The semiconductor memory device according to claim 5,
wherein the refresh address output unit outputs an address match signal when the weak cell address and the counting address match each other, and
wherein the control signal generation unit outputs the comparison signal according to the address match signal.

7. The semiconductor memory device according to claim 6, wherein the control signal generation unit comprises:
an S-bit counter suitable for counting the refresh signal by the unit of S bits, and generating the update signal which is enabled each time a counting number reaches the first target value and a source signal which is enabled each time a counting number reaches the second target value;
a mask signal generation section suitable for being enabled in response to the address match signal, and generating a mask signal which is disabled in response to the source signal; and
a comparison signal generation section suitable for generating the comparison signal which is enabled in response to the source signal while disabling the comparison signal when the mask signal is enabled, regardless of the source signal.

8. The semiconductor memory device according to claim 7, wherein the mask signal generation section comprises:
a delay suitable for delaying the source signal by a preselected time; and
a latch suitable for being set in response to the address match signal, being reset in response to an output of the delay, and outputting the mask signal.

9. The semiconductor memory device according to claim 7, wherein the weak cell information update unit comprises:
an update section suitable for updating the weak cell information in response to the update signal, and storing the updated weak cell information; and
an output section suitable for outputting the updated weak cell information as the weak cell address in response to the source signal.

10. The semiconductor memory device according to claim 6, wherein the refresh address output unit comprises:
an address selection section suitable for outputting the refresh address by selecting one of the weak cell address and the counting address in response to the comparison signal; and
an address match signal generation section suitable for outputting the address match signal when the weak cell address and the counting address match each other.

11. The semiconductor memory device according to claim 10, wherein the address match signal generation section comprises:
a plurality of unit comparators suitable for comparing respective bits of the weak cell address and respective bits of the counting address; and
a summing part suitable for summing outputs of the plurality of unit comparators, and generating the address match signal.

12. The semiconductor memory device according to claim 5, wherein the address counter comprises:
a clock control section suitable for outputting the refresh signal as a clock signal, and blocking the refresh signal when the comparison signal is enabled; and a counting section including a plurality of latches which are coupled in series, suitable for receiving the clock signal through clock terminals thereof, and generating the counting address.

13. The semiconductor memory device according to claim 1, wherein the first cell region comprises a dummy mat.

14. A semiconductor memory device comprising:
a weak cell storage circuit suitable for programming therein a weak cell information, and outputting the weak cell information in an initialization operation;
a cell array region suitable for storing data in memory cells selected according to a word line enable signal and a column select signal, and including a first cell region which stores the weak cell information received from the weak cell storage circuit, in the initialization operation;
a refresh control circuit suitable for outputting a target row address by selecting a refresh address generated based on a refresh signal or a row address, storing the weak cell information from the first cell region in response to the refresh signal, and generating the refresh address based on the stored weak cell information such that a refresh cycle is controlled;
a row circuit suitable for decoding the target row address and activating the word line enable signal; and
a column circuit suitable for decoding a column address and outputting the column select signal.

15. The semiconductor memory device according to claim 14, wherein the refresh control circuit comprises:
a refresh address generation block suitable for generating a weak cell address corresponding to the weak cell information transferred from the first cell region, as the refresh address by counting the refresh signal, with a predetermined cycle; and
an address selection block suitable for outputting the target address by selecting one of the refresh address and the row address in response to the refresh signal.

16. The semiconductor memory device according to claim 15, wherein the refresh address generation block comprises:
a control signal generation unit suitable for counting the refresh signal by an unit of S bits, generating an update signal which is enabled each time a counting number reaches a first target value and a source signal which is enabled each time a counting number reaches a second target value larger than the first target value, and outputting a comparison signal by masking the source signal according to an address match signal;
a weak cell information update unit suitable for updating the weak cell information in response to the update signal, and outputting an updated weak cell information as the weak cell address based on the source signal;
an address counter suitable for generating a counting address by counting the refresh signal, and interrupting counting of the refresh signal in response to the comparison signal; and
a refresh address output unit suitable for outputting the refresh address by selecting one of the weak cell address and the counting address in response to the comparison signal, and outputting the address match signal when the weak cell address and the counting address match each other.

17. The semiconductor memory device according to claim 14, further comprising:

an information transmission control circuit suitable for generating a row information address and a column information address for sequentially outputting the weak cell information stored in the first cell region by an unit of predetermined bits according to the refresh signal.

18. A method for operating a semiconductor memory device including a memory array region, the method comprising:
storing a weak cell information received from a weak cell storage circuit, in a first cell region of the memory array region, in an initialization operation;
generating a refresh address by counting a refresh signal in a refresh operation, and outputting a weak cell address corresponding to the weak cell information outputted from the first cell region, as the refresh address, with a predetermined cycle; and
performing the refresh operation for a word line corresponding to the refresh address, among a plurality of word lines.

19. The method according to claim 18, wherein the generating of the weak cell address comprises:
repeatedly performing successively outputting refresh addresses corresponding to a predetermined number of word lines by counting the refresh signal, and outputting the weak cell address as the refresh address.

20. The method according to claim 18, wherein the generating of the weak cell address comprises:
repeatedly performing successively outputting refresh addresses corresponding to a predetermined number of word lines by counting the refresh signal, interrupting the counting and outputting the weak cell address as the refresh address.

21. The method according to claim 20, wherein, when one of the refresh addresses corresponding to the predetermined number of word lines is identical to the weak cell address, the outputting of the weak cell address as the refresh address is omitted, and refresh addresses corresponding to a next predetermined number of word lines are successively outputted by counting the refresh signal.

22. The method according to claim 18, wherein the generating of the refresh address comprises:
generating a counting address by counting the refresh signal, and outputting the counting address as the refresh address;
counting the refresh signal by an unit of S bits, and generating an update signal which is enabled each time a counting number reaches a first target value and a comparison signal which is enabled each time a counting number reaches a second target value larger than the first target value;
interrupting counting of the refresh signal in response to the comparison signal, and outputting the weak cell address corresponding to the weak cell information, as the refresh address; and
receiving and updating a next weak cell information from the first cell region in response to the update signal.

23. The method according to claim 22, further comprising:
outputting an address match signal when the weak cell address and the counting address match each other; and
outputting the comparison signal according to the address match signal.

* * * * *